United States Patent [19]

Abbe et al.

[11] 4,158,171
[45] Jun. 12, 1979

[54] WAFER EDGE DETECTION SYSTEM

[75] Inventors: Robert C. Abbe, Newton; Noel S. Poduje, Needham Heights, both of Mass.

[73] Assignee: ADE Corporation, Watertown, Mass.

[21] Appl. No.: 833,258

[22] Filed: Sep. 14, 1977

[51] Int. Cl.$^2$ .................... G01R 31/02; G01R 27/26; G01R 35/00
[52] U.S. Cl. ................... 324/158 F; 318/662; 324/61 R; 324/130
[58] Field of Search ................. 324/158 F, 130, 73 R, 324/74, 61 R, 61 P; 361/280; 318/662

[56] References Cited
U.S. PATENT DOCUMENTS

| | | | |
|---|---|---|---|
| 3,706,919 | 12/1972 | Abbe | 361/280 |
| 3,711,774 | 1/1973 | Bohler | 324/130 |
| 3,778,710 | 12/1973 | Snook | 324/130 |

Primary Examiner—Rudolph V. Rolinec
Assistant Examiner—Ernest F. Karlsen
Attorney, Agent, or Firm—Weingarten, Maxham & Schurgin

[57] ABSTRACT

A noncontact gauge for edge detecting of semiconductor wafers in a test rig which indexes between circuits in the semiconductor wafer to provide functional tests upon them. The noncontact gauge includes a capacitive probe having an elongated finger that is bent into position a few thousands of an inch above the wafer when positioned for circuit tests in order to detect whether the circuit test system, in indexing from circuit to circuit in the row and column matrix of integrated circuit chips in the wafer, has moved to one edge or the other of the water. The edge detection system operates with conventional wafer test systems which raise and lower the wafer between tests to index from one integrated circuit to the next in the wafer matrix. When the wafer is in the down position, the circuitry, which includes an automatic compensation system, changes modes to calibrate the edge detector circuit for a predetermined capacitance representative of capacitance sensed by the finger of the probe when the wafer is moved out of proximity. Additionally, the circuitry and in particular the energization for the capacitive probe, is de-energized for a portion of the period when the wafer is in position and a particular integrated circuit being tested in order to eliminate interference between the probe excitation and the check-out circuitry.

16 Claims, 3 Drawing Figures

WAFER EDGE DETECTION SYSTEM

FIELD OF THE INVENTION

The present invention relates to the control of automated integrated circuit testers and in particular to an edge detector for a wafer containing a row and column matrix of integrated circuits.

BACKGROUND OF THE INVENTION

In the fabrication of integrated circuits, it is conventional to produce a multiplicity of identical integrated circuits in a single large wafer of semiconductor crystal with the individual identical circuits numbering into the thousands and arranged in a matrix of rows and columns throughout the crystal. Before the individual integrated circuit elements are severed from each other for further assembly into the marketed product, it is conventional to test each circuit to insure that it operates within performance limits. This has typically been done by aligning the matrix in a test fixture (such as a Teledyne TAC PR-100 wafer prober) which moves the wafer up and down into contact with a plurality of electrical leads which probe the circuit terminal pads. Each time the wafer is moved up or down it is indexed one circuit space to the right or left or across until the test head has probed each circuit in a row or column.

In this test process, the edge of the wafer is typically detected using a mechanical edge detector which is positioned to contact the wafer each time it is raised in position for operation of the test head. Failure of the probe to make mechanical contact with the wafer is an indication of the passage of the edge and causes the test system to alter its indexing motion in some predetermined manner such as by moving to the next row.

The gauging of edge position by mechanical contact, as has been practiced in the past, has led to damage to the wafer in particular circuit areas where the edge detecting probe strikes the wafer on its way up for engagement with the test head. Various forms of noncontact gauging might be employed but there are environmental and placement problems to be overcome with such devices. Capacitor gauging provides one alternative, but adds the difficulty of interference with the circuit test circuitry from the active gauging probe as well as error effects resulting from the necessary use of a very small capacitance variation between conditions of wafer and no wafer.

SUMMARY OF THE INVENTION

In accordance with the teaching of the present invention a noncontact capacitive edge detecting system is provided in which the problems of electrical interference with the integrated circuit test head and system, as well as errors resulting from environmental effects, are eliminated. This is achieved by taking advantage of the natural transport motion of the semiconductor wafer in a test system to index the circuit test head from one integrated circuit element to another.

More particularly, in accordance with the present invention, a capacitive probe is provided with a capacitance sensitive thin wire finger. The finger is positioned to a point where its tip is a few thousands of an inch above a semiconductor wafer in a test fixture when the wafer is in a position of engagement with a test head for probing individual integrated circuit elements. The probe is energized by a circuit to provide an output representative of the capacitance sensed by the probe and the output is processed to provide an indication of whether the finger tip is positioned above the surface of the wafer or at a position beyond one edge of the wafer each time the wafer is moved up for engaging the test head. In order to avoid environmental variations, such as changes in the relative position of the probe finger and the wafer fixture or bending of the probe wire which changes the point of sensing at the operator's desire, the circuit responsive to the probe output is automatically recalibrated each time the wafer is transported down from the head. In this position a well-defined reference capacitance is sensed by the probe finger and the circuitry automatically adjusted to reflect it. Additionally, after each time the wafer is moved into engagement with a test head by the wafer fixture, the probe energization circuit is deactivated to prevent interference from the high frequency excitation of the probe in the test head.

In this manner, a very accurate and reliable detection of wafer edge in integrated circuit testing is provided without the need for actual mechanical contact to the wafer.

BRIEF DESCRIPTION OF THE DRAWING

These and other features of the present invention are more fully set forth below in the detailed description presented for purposes of illustration and not by way of limitation and in the accompanying drawing of which:

FIG. 3 is a timing diagram illustrative of the control operation and sequencing of the present invention.

DETAILED DESCRIPTION OF THE INVENTION

The present invention contemplates a system for non-contact edge gauging in a system in which a plurality of sites in a matrix on the surface of a substrate are probed in some pattern which necessitates indexing decisions based upon edge detection. In particular, the system is applied to testing of integrated circuit matrices in a semiconductor wafer which is fixtured within an automated test rig. In such applications, the system continuously recalibrates the capacitance probe against environmental variations and selectively disables the high frequency edge detection circuitry to avoid impairing the integrated circuit testing function.

Figure 1:
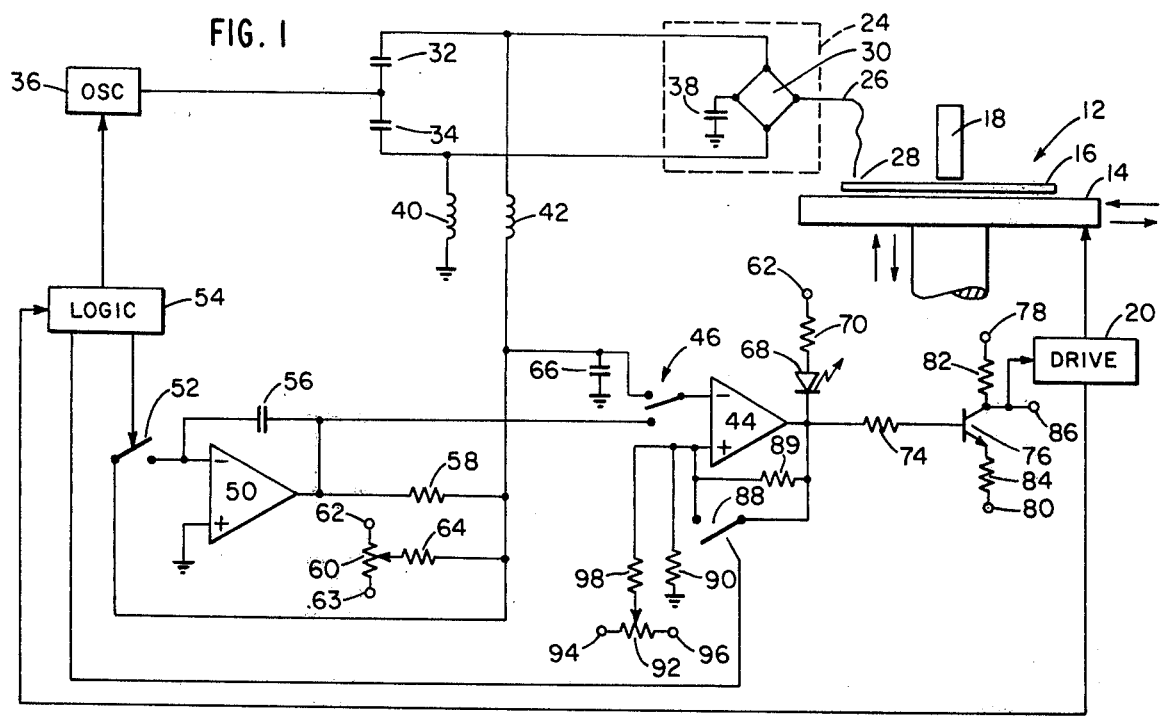
FIG. 1 is a simplified block diagram illustrative of the general elements of operation of the present invention.

The invention as may now be described with respect to FIG. 1 is operative in preferred form with a semiconductor integrated circuit test system 12 (such as the Teledyne unit referenced above) which includes a platform 14 on which a wafer 16 of semiconducted material is located and which has on the surface thereof a plurality of preformed integrated circuits arranged in a row and column matrix which are to be individually tested by a test head 18 typically having a plurality of electrical contact probes designed to contact the circuit terminal pads of the integrated circuit. When the probes are in electrical contact with the integrated circuit terminal pads, the circuit is energized in some predetermined manner. The response of the circuit tested is an indication of circuit performance. In performing this test function, the platform 14 is typically moved by a drive system 20 upwardly and downwardly into engagement of the integrated circuit terminal pads with the probe head 18 with intermediate horizontal motion of the platform 14 produced by drive system 20 to index the wafer 16 to the next circuit being tested.

The test head 18 will typically test along an entire row, or column, until it hits the edge (or a set distance beyond it to insure all circuits are tested) then index to the next row or column and proceed down it until the opposite edge is reached. This necessitates some form of edge detection which in the past has been achieved by a mechanical contact to the wafer 16 with resulting wafer damage.

In accordance with the present invention capacitive edge detection is provided through the use of a capacitive distance gauging probe 24 having a thin wire finger 26 which is bent and positioned so as to be proximate to the wafer 16 in a location 28 when the platform 14 is fully elevated and the contacts of the test head 18 applied to the circuit terminal pads. Typically, the gap between the finger 26 and the wafer 16 is set to 5-10 mils approximately.

The probe 24 includes a capacitive diode ring 30 in accordance with the teaching of our U.S. Pat. No. 3,706,919. It is excited through first and second capacitors 32 and 34 from an oscillator 36 across opposite junction points of the diode ring 30. The other set of opposite junction points drive the finger 26 and a balance capacitor 38 as illustrated in the above-referenced patent.

The probe output is taken through a pair of inductors 40 and 42 at the junction between the diode ring 30 and the capacitors 32 and 34. One output, that through the inductor 40 is grounded to represent a circuit common, while the other is fed to the inverting input of a comparator 44 through a switch 46 when in the normally closed position. The same signal is applied to the inverting input of an amplifier 50 through a switch 52. Switch 52 is in the normally open position as controlled by a logic circuit 54. The amplifier 50 is operated in an integration mode with a feedback capacitor 56 applied from the output thereof to the inverting input. The noninverting input of the amplifier 50 is grounded. The output of the amplifier 50 is applied through a resistor 58 to the inductor 42 and to the normally open side of switch 46 for test purposes. A coarse bias adjustment is provided on the line from the inductor 42 by a potentiometer 60 between voltage terminals 62 and 63 through a resistor 64.

The input to the comparator 44 is r.f. by-passed through a capacitor 66. The output of the comparator 44 is applied to a light emitting diode 68 biased through a resistor 70 from a voltage supply terminal 62. The output of the comparator 44 is also applied through a resistor 74 to the base of a transistor 76 functioning as an output transistor. The collector and emitter of the transistor 76 are respectively supplied from voltage terminals 78 and 80 through corresponding resistors 82 and 84. An output indication of proximity is provided from the collector of the transistor 76 at a terminal 86.

The output of the comparator 44 is selectively connected through a switch 88, controlled by the timing of the logic circuit 54 for connection to the noninverting input of the comparator 44. A feedback resistor 89 bridges switch 88 to provide hysteresis. The same noninverting input is also typically biased to ground through a resistor 90 and provided with an adjustment in the point at which the comparator 44 shifts to indicate proximity of the wafer 16 to the finger 26 through a resistor 98 to a potentiometer 92 connected between different voltage terminals 94 and 96.

The logic circuit 54 is typically responsive to the machine sequencing control of the wafer tester to establish a plurality of intervals in accordance with the timing diagram of FIG. 3 using standard gating technology. In FIG. 3, waveform 100 represents the relative position of a platform 14, "up" being when the test head 18 is contacted by the selected integrated circuit in the wafer 16 with its probes making electrical connection to the circuit terminal pads. In the "down" position, the platform 14 is away from the test head 18 and correspondingly the wafer 16 is removed to a point below the finger 26. Also in the down position, the typical integrated circuit test system will index the position of the platform 14 so that on the subsequent upward positioning of the platform it will present an adjacent integrated circuit to the test head 18. A waveform 102 represents the output of the logic circuit 54 to control the oscillator 36 as well as the calibration switch 52. As indicated, for an interval of approximately 15 milliseconds in the standard integrated circuit test cycle a turn-on signal is generated to close the switch 52 and enable the oscillator 36. At this point, the finger 26 is located away from the platform 14 and the variable capacitance which depends upon position of the edge of the wafer 16. The capacitance thus measured is defined as a reference value from which capacitance change is detected. This change is large when the wafer is near finger 26, and much smaller when the finger is placed beyond an edge. In this mode, the amplifier 50 will drive the capacitor 56 to a charge which provides an output that balances current from the probe and from the potentiometer 60, thus providing a zero input to comparator 44. Capacitor 56 will thus assume a charge representative of a stray capacitance measured by the finger 26 along with other system offsets. The potentiometer 60 is provided to make a coarse adjustment in this operation to set the output at the amplifier 50 close to zero initially, as monitored by changing switch 46 manually. When the switch 52 is subsequently opened by the pulse illustrated in waveform 104, directly subsequent to the pulse in waveform 102, the amplifier 50 will then continue to provide an output corresponding to the reference capacitance and offset conditions for a period determined by the circuit time constant. This time constant should be large enough for the measurement interval and short enough to charge capacitor 56 during the "down" time. Operation of this circuit is similar to that shown in commonly assigned U.S. Pat. No. 3,986,109.

As illustrated in the waveform 100 of FIG. 3, a transition period 106 exists between the "down" position of the platform 14 and the "up" position. During this transition interval the oscillator is still enabled. The compensation circuit, set when the switch 52 is closed and consisting of the amplifier 50 and its circuitry, has previously been placed in a hold condition by waveform 104 maintaining a reference output. During this upward motion, the capacitance sensed by finger 26 will at one point detect the presence of the wafer 16 if it has not passed beyond the edge. Such a point is illustrated as point 108 in the waveform 110 illustrating a representative output from the terminal 86. A short inhibit interval 112 is illustrated in the waveform 100 as a preferable point to avoid reading any output since it brackets the turn-on time of the oscillator illustrated in the waveform 102. Such a signal may be generated by processing electronics responsive to the output terminal 86.

Shortly after the platform has been elevated, the oscillator is turned off by the pulse illustrated in waveform 114 in FIG. 3 in order to remove r.f. signals from the vicinity of the test head 18 where they would otherwise be provided by the finger 26. This inhibition lasts until the subsequent turn-on pulse illustrated in the waveform 102 resets the compensation circuitry of amplifier 50 as well as the oscillator 36.

Potentiometer 92 provides an adjustment to the set point of the output at terminal 86 as illustrated in waveform 110. The light emitting diode 68 provides a visual indication of proper setting. Accordingly, with the finger 26 in close proximity to the wafer 16, the potentiometer 92 may be adjusted until the light emitting diode 68 triggers and then advanced further in the same direction to insure that it is beyond the detection threshold. When the light is then not illuminated but the platform elevated, it will be an indication that the finger 26 is beyond the edge of the wafer 16 and the test circuit can act accordingly to adjust the indexing between circuit elements in the wafer.

A switch 88 is controlled also by the logic 54 in accordance with the waveform patterns 114 and 102 in order to close the switch to provide positive feedback around the comparator 44 to latch it in its immediately present state when the r.f. of the oscillator 36 is disabled by the logic circuit 54.

Figure 2:
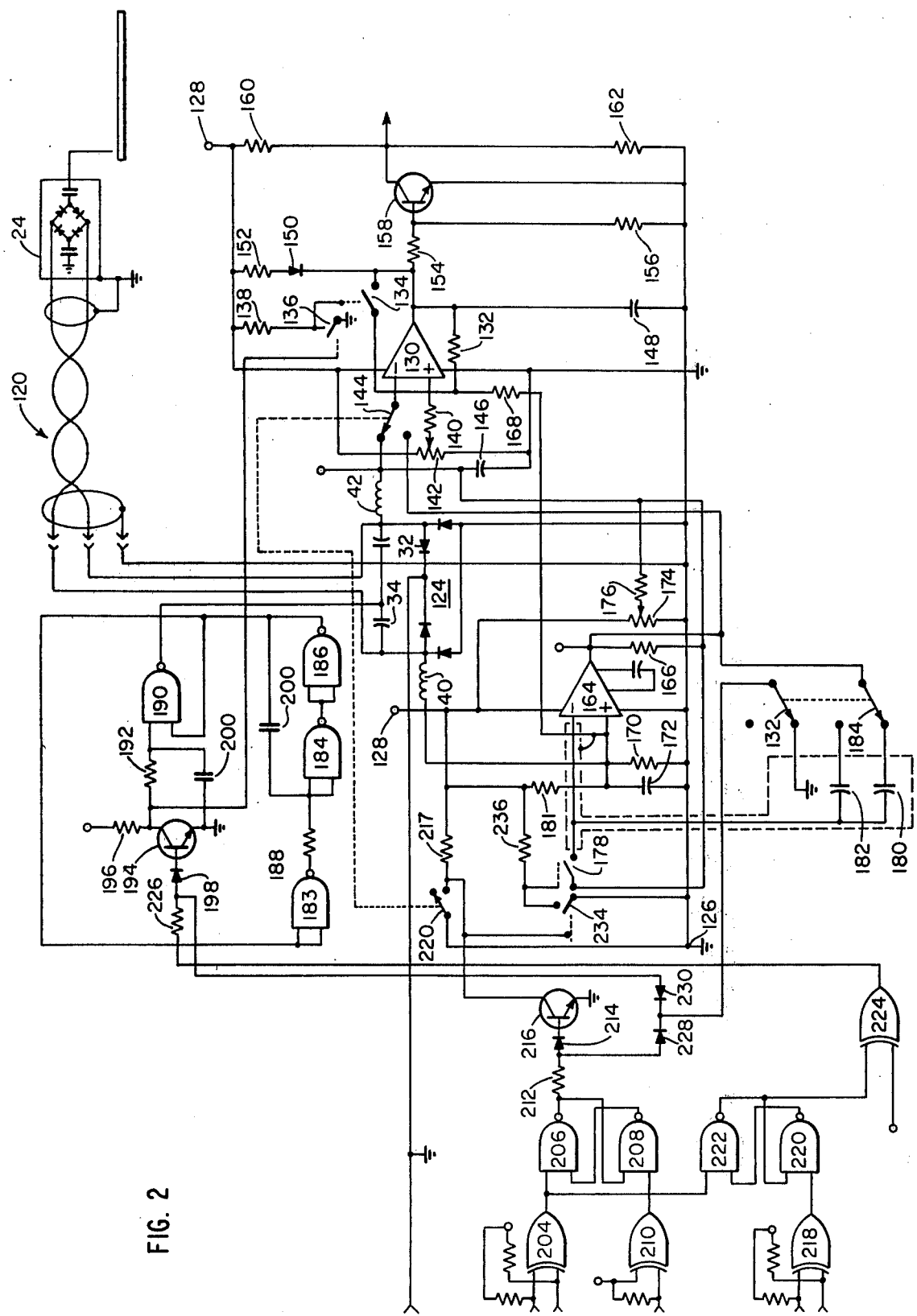
FIG. 2 is a detailed schematic diagram of the circuitry for noncontact probing of the semiconductor wafer edge in accordance with the present invention.

With respect to FIG. 2, there is illustrated a circuit diagram of the edge detection system of FIG. 1 showing a complete implementation thereof. As shown there, the probe 24 is separated from the main circuitry by a twisted pair of shielded cable 120 which is connected to the circuit between the inductors 40 and 42, and capacitors 34 and 32.

The junctions between the two sets of capacitors and inductors are applied to opposite terminals of a diode network 124 of which the other opposite terminals are connected in reverse conduction to the ground and positive supply terminals 126 and 128 respectively to provide overvoltage protection. The far side of the inductor 42, from the capacitor 32, is connected to the inverting input of comparator 130 corresponding to the comparator 44 in FIG. 1. The noninverting input of the comparator 130 receives a positive feedback from the output for hysteresis through a resistor 132 which is shunted through a solid state switch 134, driven for inversion by a solid state switch 136, and biased through a resistor 138 from the positive supply terminal 128. The switch 134 serves the purpose of the switch 88 in FIG. 1. The noninverting input also receives a trip adjust input through a resistor 140 from a potentiometer 142 connected between the positive supply terminal 128 and the ground terminal 126 as explained above. The inverting input of the comparator 130 receives its signal through a switch 144 which in the normal position is connected to provide conduction between the inverting input and the inductor 42 but in the alternative position connects the inverting input to the output of the amplifier 164 (50) for initial adjustment explained above. Capacitors 146 and 148 are provided for r.f. by-pass.

The output of the comparator 130 is applied to a light emitting diode 150 biased through a resistor 152 from the positive supply terminal 128. The output of amplifier 130 is similarly applied through a voltage divider consisting of resistors 154 and 156 to the base of an output transistor 158. The transistor 158 is operated in an inverting mode with the emitter grounded and the collector supplied between resistors 160 and 162. The output is taken at the resistor junction and the opposite terminals of the resistors respectively connected to the positive supply terminal 128 and ground terminal 126.

The automatic compensating system consists of an amplifier 164 the output of which is connected through a resistor 166 to the inverting input of the amplifier 130 in the normal mode, and directly to that inverting input when the switch 144 is thrown for initialization as explained above. The noninverting input of the amplifier 164 references, through a resistor 168, the noninverting input of the comparator 130 and is biased to ground through a resistor 170 and r.f. by-pass capacitor 172. A potentiometer 174 is connected between the positive and the ground terminals 128 and 126 respectively and applies a voltage through a resistor 176 to the inverting input of the amplifier 130 through switch 144 in the normal state as well as to a normally open solid state switch 178, the selectively closed terminal of which is applied to the inverting input of the amplifier 164. Switch 178 corresponds to switch 52. Connected to the inverting input of amplifier 164 are first and second capacitors 180 and 182 which are alternatively connected through a manual switch 184 to the output of amplifier 164 in the manner of capacitor 56. These are of different value, capacitor 180 being of a size for automated operation as explained above, while capacitor 182 is larger to provide a greater time constant to facilitate initial setup. The inductor 40 is connected to the noninverting input of the amplifier 164 as a common terminal. Finally, the noninverting input is further biased from the positive supply terminal 128 through a resistor 181 to establish a circuit common at a reference value between ground and the voltage of terminal 128.

The oscillator consists of a set of three NAND gates 183, 185 and 186 acting as amplifier inverters, serially connected, with a resistor 188 between the inputs of the gates 183 and 185 and with positive feedback from the output of the gate 186 to the input of the gate 183 and negative feedback from gate 186 to gate 185 through a capacitor 200. A further NAND gate 190 is provided and driven at its input through a resistor 192 from an inverting transistor 194 in the common emitter mode with the collector supplied through a resistor 196 and the base driven through a diode 198. The second input of the NAND gate 190 is driven from the output of the NAND gate 186. Gate 190 serves as a buffer for driving the probe through the capacitors 132 and 134 to which its output is connected. The transistor 194 operates as an inhibit or turn-off control for the oscillator as will be explained below. For this purpose, the output of the transistor 194 is applied to the solid state switch 136 activating the switch 134 when the oscillator is inhibited. A by-pass capacitor 202 is connected between ground and the input at resistor 192 of the NAND gate 190.

Logic control in accordance with the above requirements is provided through a set of gates. A first exclusive OR gate 204 receives the input corresponding to the pulse in waveform 102 and provides an output to a first input of a NAND gate 206 connected in a cross-coupled, or latch, configuration with a second NAND gate 208. The noncross-coupled input of the gate 208 receives an input from an exclusive OR gate 210 used as an inverter which in turn receives as one input the signal corresponding to the waveform 104 to disable the compensation circuit. The gate 204 receives a second input which permits it to respond to inverted logic. The output of the NAND gate 206 is applied through a resistor 212 and isolation diode 214 to a buffer amplifier 216, the collector of which is connected through a resistor 214 to the positive voltage supply.

A further exclusive OR gate 218 is provided to receive logic corresponding to the waveform 114, with a second input provided to invert the logic pattern and its output is applied to a first input of a NAND gate 220 interconnected with a second NAND gate 222 in a cross-coupled configuration to provide a latch function. The second NAND gate 222 receives on the second input the ouput of the OR gate 204. The output of the NAND gate 222 is applied through the input of an exclusive OR gate 224 for inversion with its output driving, through a resistor 226 and diode 198, the transistor 194.

The outputs from the NAND gate 206 and exclusive OR gate 224, after the resistors 212 and 226, are applied through respective isolation diodes 228 and 230 to a switch 232 which may selectively ground these points or not under manual control. When ungrounded, the compensation system operates in its normal automatic manner. The output of the transistor 216 is provided to drive a solid state switch 234 which connects the positive voltage terminal 128 through a resistor 236 to drive the solid state switch 178 thereby enabling the autocompensation function.

A manual switch 240 operating in unison with switch 144 is provided to turn the automatic compensation system on or off. In the off or normal position, the switch 144 directly connects the inductor 42 to the inverting input of comparator 130 and supplies the transistor 216 through the resistor 217. When connected in the opposite condition, the transistor 216 is grounded at its collector eliminating its automatic function and the comparator 130 is directly connected to the output of the amplifier 164 to initialize. In this condition, the circuit may be calibrated with the potentiometer 174 as indicated above to provide nearly nominal output condition for amplifier 164.

The collector of the transistor 194 drives the switch 136 so that in the inhibit oscillator condition, the switch is energized and the latching feedback to the noninverting input around the amplifier 130 is connected into circuit.

The thus described system provides a convenient and accurate noncontact edge detection system for wafer probing without the problems of physical contact of conventional probing designs and also avoids the potential difficulties of active probe circuitry from environmental errors and circuit interference.

The invention may be practiced in forms other than those described above including improvements thereto and it is accordingly intended to limit the scope of the invention only as indicated in the following claims.

We claim:

1. An edge detecting system comprising:
   a capacitive distance gauging probe having an electrical conductor as a capacitance sensitive element of said probe;
   means for energizing said probe to provide an output signal representative of capacitance sensed by said probe conductor and thereby adapting said probe to provide an output indication of the proximity of said conductor to an edged element capable of motion toward and away from said conductor in combination with motion of said element in a direction to bring said conductor along said element toward and away from the edge thereof;
   means for adjusting the value of said output indication in response to a control;
   compensating means having first and second states and operative in the first state thereof in response to the probe output signal for providing an indication of placement of said conductor with respect to an edge of said element;
   said compensating means being further adapted for operation in the second state thereof in response to the probe output signal when said element is moved away from said conductor to provide a control for said adjusting means which, in the first state of said compensating means, provides an output indication corresponding to a predetermined reference output in combination with an output representative of the difference in capacitance sensed by said probe in the away and near conditions; and
   means for controlling a direction of motion of said element in response to the indication of placement of said conductor with respect to said edge of said element.

2. The system of claim 1 wherein said element is a semiconductor wafer.

3. The system of claim 2 further including a semiconductor positioning device provided to cause the motion of said element toward and away from said conductor as well as to cause the conductor to move along said element toward said edge.

4. The system of claim 1 further including means for disabling said energizing means and adapted to provide disablement thereof in response to a control.

5. The system of claim 4 further including:
   a semiconductor chip test system for which said element comprises a semiconductor wafer having a multiplicity of semiconductor chips therein which are tested in some pattern by said semiconductor test system in conjunction with motion of said wafer toward and away from said conductor to provide motion of said conductor with respect to said wafer across said wafer toward said edge; and
   means for causing said inhibiting means to inhibit said energizing means during periods of electrical testing of said wafer chips by said semiconductor chip test system.

6. A process for electrically testing a plurality of electrical elements arranged in a matrix on a surface substrate comprising the steps of:
   moving said substrate away from a test head for testing circuit elements of said substrate;
   automatically calibrating a capacitive probe having a capacitive sensing finger thereon in the away position of said substrate;
   moving said substrate toward said test head and said capacitive probe finger;
   detecting relative edge position of said wafer at said capacitive probe finger;
   removing energization from said probe;
   testing circuit element operation with said test head;
   at some point in the above-stated steps indexing the position of said test head with respect to circuit elements in said substrate in a first direction in response to detection of substrate edge to one side of said finger and indexing said test head with respect to said circuit elements in said wafer in a different direction in response to detection of wafer edge to the other side of said finger.

7. The process of claim 6 wherein:

said step of calibrating said probe for a predetermined capacitance includes the step of energizing a compensating circuit for a predetermined period followed by de-energization to maintain a predetermined compensation signal while said substrate is in other than the away condition;

said edge detecting step including the step of detecting said edge as a function of the compensation signal of said compensation circuit.

8. The process of claim 6 wherein said step of moving said substrate toward said finger of said probe includes the step of positioning said substrate within a range of approximately 5–10 mils of a tip portion of said probe finger.

9. The process of claim 6 wherein the steps of said claim 6 are repeated a number of times.

10. The process of claim 6 further comprising the step of providing initial calibration of said probe as a coarse level adjustment.

11. The system of claim 1 wherein:
said compensating means in said first state includes capacitor means for providing said control signal and having a predetermined time constant.

12. The system of claim 11 wherein said capacitor means includes means for selectively increasing said time constant.

13. The system of claim 1 wherein said compensating means includes means for causing said control to provide said reference output compensated for variations in capacitance sensed by said probe in the away condition in combination with other system offsets.

14. The system of claim 1 wherein said reference output is a predetermined signal level.

15. An edge detecting system comprising:
a capacitive distance gauging probe having an electrically conducting finger as a capacitance sensitive element of said probe;

means for energizing said probe to provide an output signal representative of capacitance sensed by said probe finger and thereby adapting said probe to provide an output indication of the proximity of said finger to an edged element capable of motion toward and away from said finger in combination with motion of said element in a direction to bring said finger along said element toward and away from the edge thereof;

comparator means responsive to the output indication and operative to provide an indication corresponding to sensed capacitance exceeding a predetermined magnitude;

amplifier means having a sample state and a hold state, and operative in the sample state to respond to said output indication to establish an amplifier output to said comparator means which means balances said output indication to provide an indication from said comparator means of sensed capacitance not exceeding said predetermined magnitude and operative in said hold state to maintain said amplifier output for an interval;

means for providing the sample state for said amplifier means when said finger is in the away condition and for said hold state after a predetermined interval thereafter; and means for changing a direction of motion of said element in response to said comparator means indicating the sensed capacitance not in excess of said predetermined magnitude in the toward position of said finger.

16. The system of claim 15 further including:
means for selectively applying the amplifier output to said comparator in exclusion of said output indication; and
means for adjusting said amplifier output.

* * * * *